United States Patent
Lee et al.

(10) Patent No.: US 8,044,420 B2
(45) Date of Patent: Oct. 25, 2011

(54) LIGHT EMITTING DIODE PACKAGE STRUCTURE

(75) Inventors: Seongoo Lee, Kyunggi-Do (KR);
Ryungshik Park, Kyunggi-Do (KR);
Hyunil Lee, Kyunggi-Do (KR);
Hyunsoo Jeong, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 52 days.

(21) Appl. No.: 12/354,609

(22) Filed: Jan. 15, 2009

(65) Prior Publication Data

US 2010/0176407 A1    Jul. 15, 2010

(51) Int. Cl.
*H01L 33/00* (2010.01)

(52) U.S. Cl. ...... 257/98; 257/100; 257/99; 257/E33.059; 257/E33.061; 257/E33.066; 257/676; 257/E23.037; 257/E21.532

(58) Field of Classification Search ............ 257/98–100, 257/676, E23.037, E21.532, E33.059, E33.061, 257/E33.066
See application file for complete search history.

(56) References Cited

U.S. PATENT DOCUMENTS

| | | | |
|---|---|---|---|
| 6,770,498 B2 | 8/2004 | Hsu | |
| 7,128,442 B2 * | 10/2006 | Lee et al. | 362/278 |
| 7,297,293 B2 * | 11/2007 | Tamaki et al. | 252/301.4 F |
| 7,663,095 B2 * | 2/2010 | Wong et al. | 250/239 |
| 2004/0084681 A1 * | 5/2004 | Roberts | 257/79 |
| 2008/0121921 A1 * | 5/2008 | Loh et al. | 257/99 |
| 2008/0194061 A1 * | 8/2008 | Medendorp | 438/118 |
| 2010/0270571 A1 * | 10/2010 | Seo | 257/98 |

* cited by examiner

*Primary Examiner* — Wai Sing Louie
*Assistant Examiner* — Bilkis Jahan
(74) *Attorney, Agent, or Firm* — J.C. Patents

(57) ABSTRACT

The present invention relates to a method for forming a package structure for a light emitting diode (LED) and the LED package structure thereof. By employing the same sawing process to cut through the trenches of the leadframe, the package units are singulated and different lead portions are simultaneously separated from each other in each package unit. Therefore, the overflow issues of the encapsulant can be avoided without using extra taping process.

9 Claims, 4 Drawing Sheets

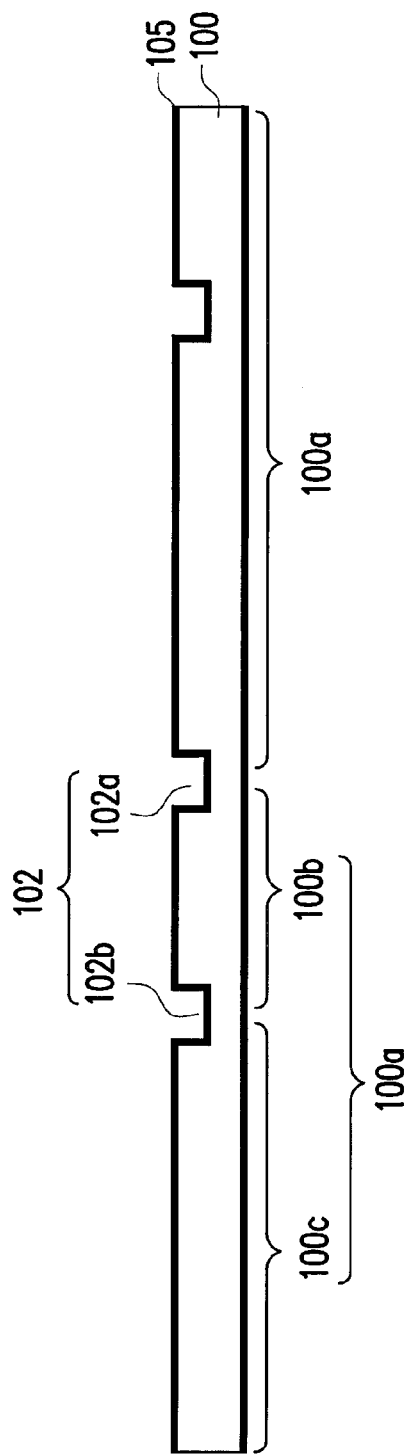
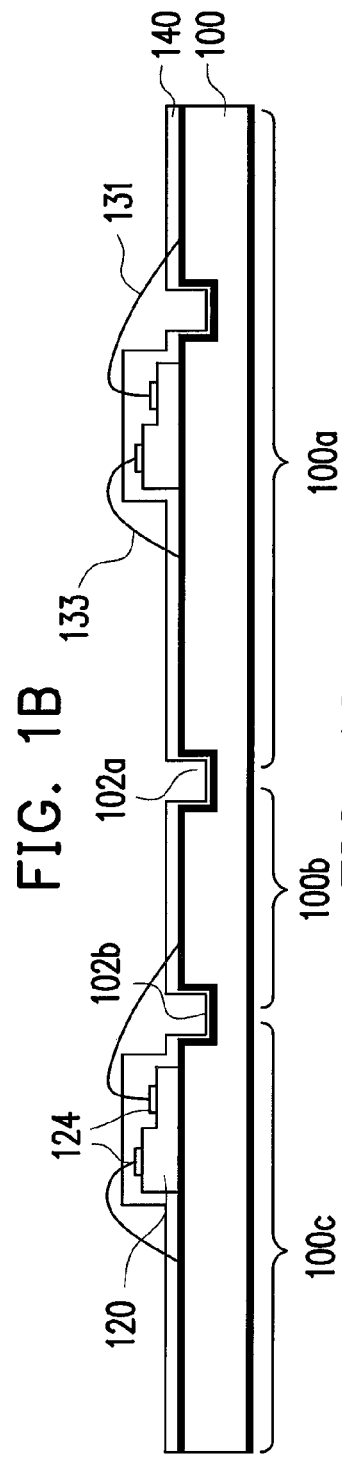
FIG. 1A
FIG. 1B
FIG. 1C

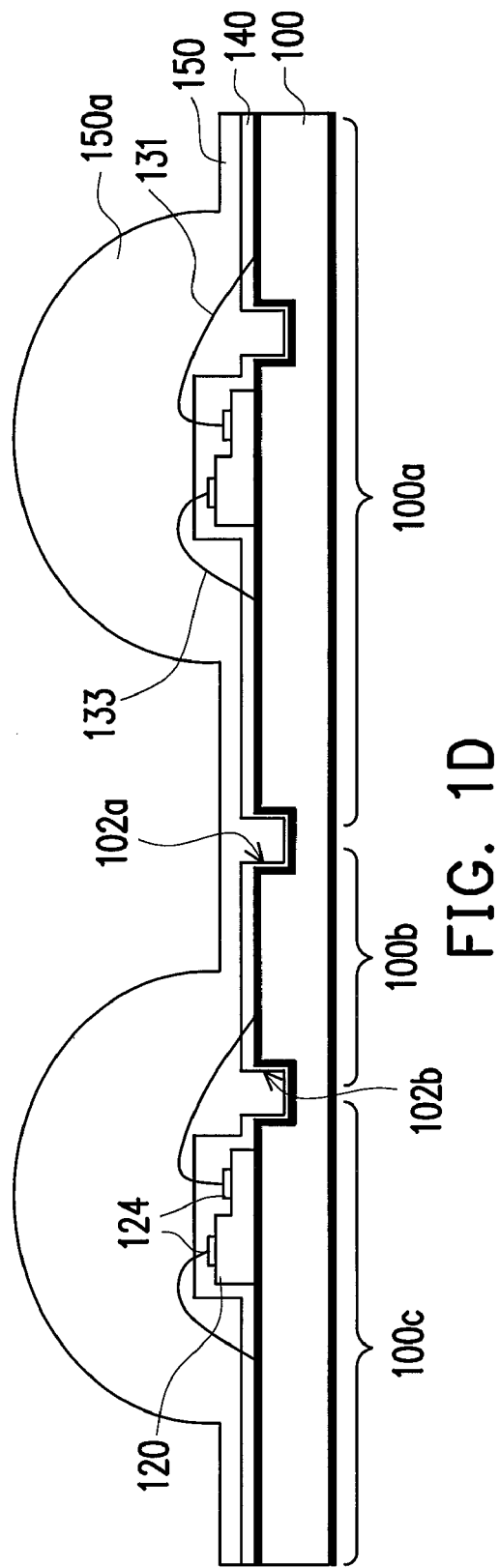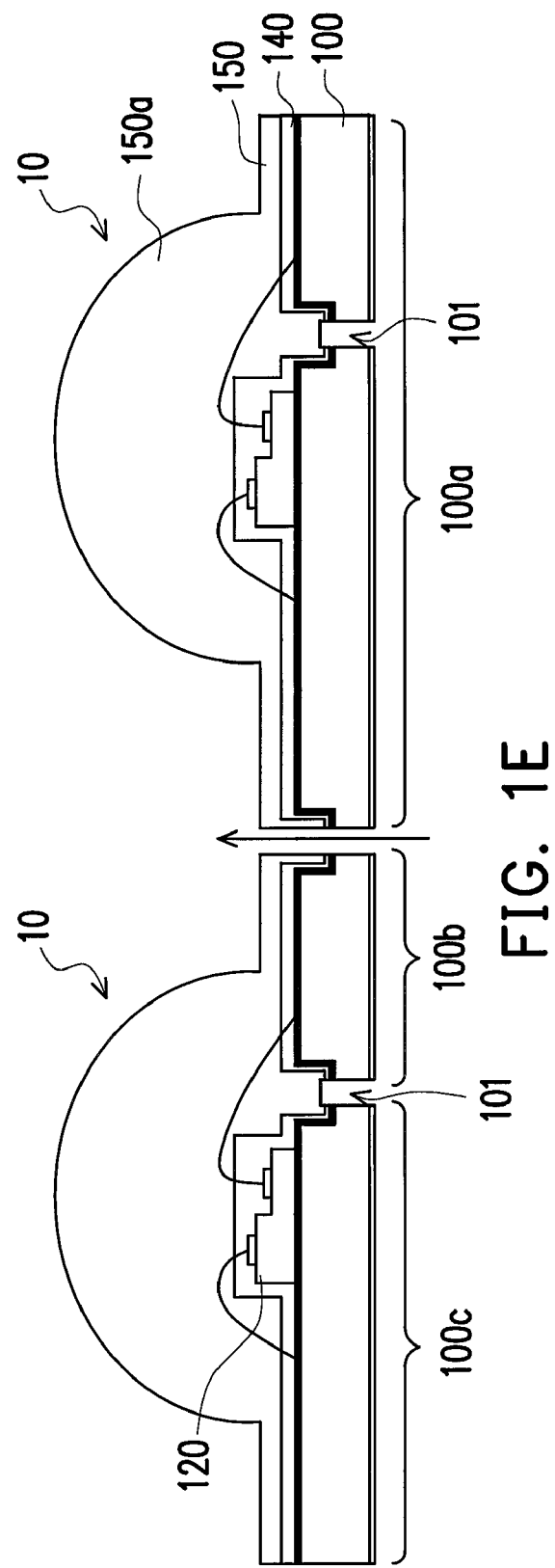

LIGHT EMITTING DIODE PACKAGE STRUCTURE

BACKGROUND OF THE INVENTION

1. Field of Invention

The present invention relates to a fabrication method of a light emitting diode package structure. More particularly, the present invention relates to a method for manufacturing a light emitting diode package structure and the package structure thereof.

2. Description of Related Art

Following the energy preservation and environmental protection concepts promoted by the developed countries in America, Europe and Asia, light emitting diodes (LEDs) become one of the most potential products, because they may replace traditional white light bulbs and become the green luminance source in the twenty-first century. At present, LEDs have been widely applied as light emitting elements in various electronic products, display panels and communication products, as they can provide miniature sizes, durability, low-driven voltages, low electricity consumption, fast response speed and good monochromatism.

Due to the cost considerations of LED packaging, it is highly desirable to provide trouble-free and undemanding processes without compromising the quality of the final LED package products.

SUMMARY OF THE INVENTION

The present invention provides a method for forming a LED package structure with better reliability performances and the LED package structure thereof.

The packaging method provided by the present invention can achieve singulation of the package units and separating different lead portions apart at the same time. The present invention also provides an LED package structure with better reliability performances.

As embodied and broadly described herein, the present invention relates to a method for forming a light emitting diode package structure. After providing a leadframe having pre-cut trenches and disposing at least one light emitting diode (LED) chips to each leadframe unit of the leadframe, an encapsulant is formed over the leadframe covering the LED chips and fills up the trenches. Subsequently, a sawing process is performed to cut through the trenches, so that the package units are singulated and different lead portions are simultaneously separated from each other in each package unit.

Since the lead portions are not separated until the sawing process, the overflow issues of the encapsulant can be avoided and no extra taping process is required.

As embodied and broadly described herein, the present invention relates to a package structure for a light emitting diode (LED). The LED package structure of this invention includes at least a light emitting diode (LED) chip disposed on and electrically connected to the leadframe, a phosphor layer covering the LED chip and the leadframe and a transparent encapsulant covers the LED chip, the phosphor layer and the leadframe. The flange of the encapsulant is tightly fitted to a recess at a periphery of the leadframe, and a portion of the encapsulant is exposed by a slit of the leadframe.

As the encapsulant is fitted to the leadframe, the package structure of the present invention possess better reliability performances owing to the increased adhesion between the encapsulant and the leadframe and elongated water permeation path.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A-1E illustrate a packaging process for a surface mount LED package according to an embodiment of the present invention.

DESCRIPTION OF THE PREFERRED EMBODIMENTS

Figure 2A:
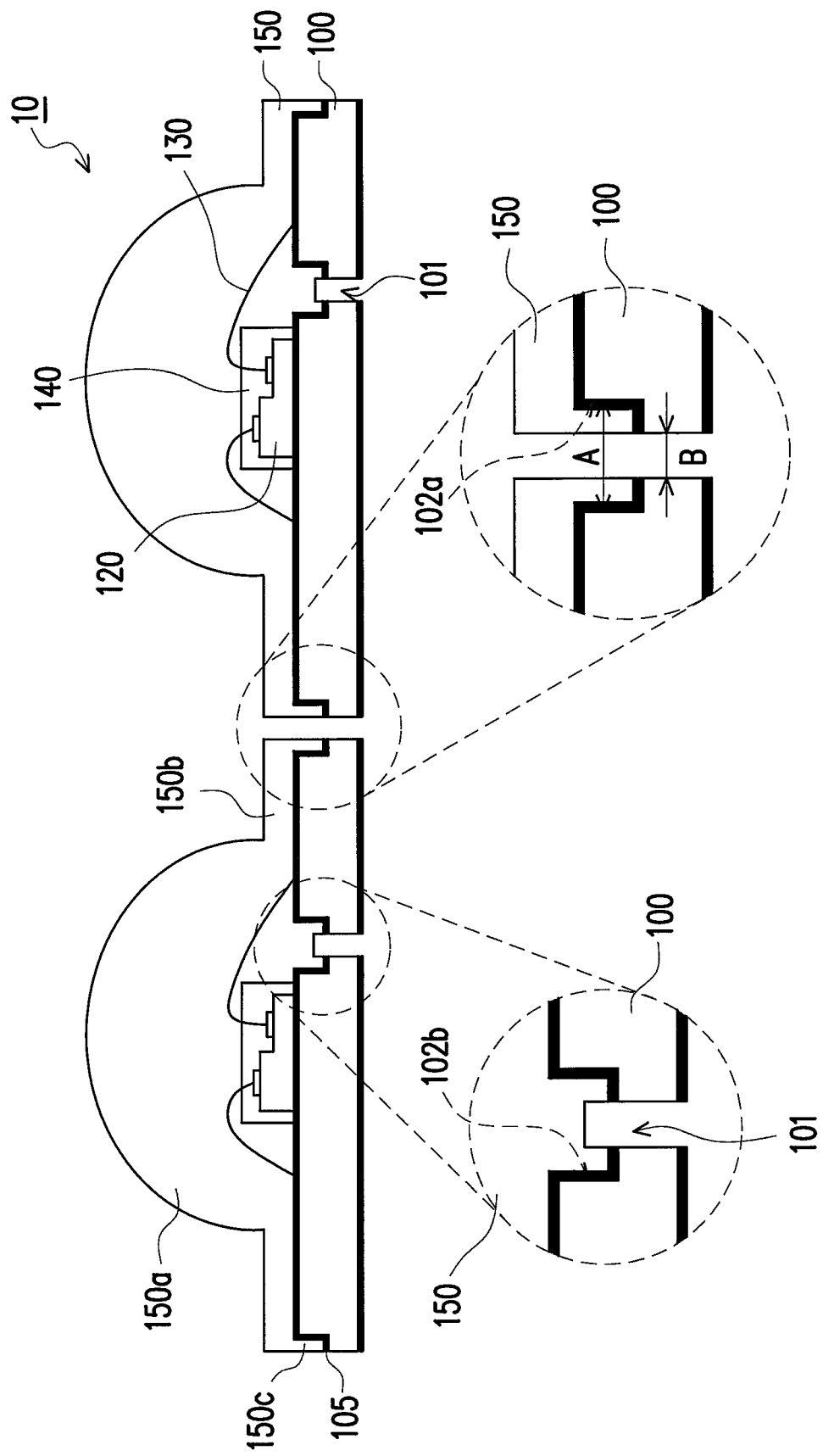
FIG. 2A is a cross-sectional display view for an LED package structure after singulation according to one preferred embodiment of this invention.

FIGS. 1A-1E illustrate a packaging process for a surface mount LED package according to an embodiment of the present invention. First, referring to FIG. 1A, a leadframe 100 having a plurality of trenches 102 is provided. In this embodiment, the leadframe 100 can be a copper leadframe or a leadframe made of other conductive materials. Trenches 102 within the leadframe 100 are formed by, for example, a pre-etching process or a pre-cutting process. The depth of the trenches 102 is about ⅓ to about ½ of the thickness of the leadframe 100, while the trench 102 can be either V shaped or U shaped, for example. The trenches 102 include a plurality of first trenches 102a and a plurality of second trenches 102b. The first trenches define the leadframe unit 100a of the leadframe 100, while each leadframe unit 100a includes a second trench that defines the first lead portion 100b and the second lead portion 100c of the unit 100a.

In addition, according to design requirement, after forming the trenches 102, the process of the present invention allows optionally plating of a silver metal layer 105 or other metal layers on the top surface of the leadframe 100, in order to increase light reflectivity.

Next, referring to FIG. 1B, an LED chip 120 is provided. The LED chip 120 is disposed on the second lead portion 100c of the leadframe unit and has at least an electrode 124 disposed on the surface of the LED chip 120. In the embodiment, the LED chip 120 can be an LED chip for producing white light, blue light, ultraviolet light or an LED chip producing other color light, for example. In this embodiment, the LED chip 120 includes two electrodes 124 on the top surface 122, and the electrode 124 (e.g. cathode) of the LED chip 120 is electrically connected to the first lead portion 100b through a wire 131 while the other electrode 124 (e.g. anode) is electrically connected to the second lead portion 100c through a wire 133. Hence, the LED chip 120 is disposed on the leadframe 100 and is electrically connected to the leadframe 100 through wires 131/133.

Alternatively, depending on design of the LED chip, two electrodes of the LED chip 120 may be disposed respectively on the top and bottom surfaces. In this case, the top electrode of the LED chip is electrically connected to the leadframe through a wire, while the bottom electrode of the LED chip is electrically connected to the leadframe through a conductor disposed between the leadframe and the LED chip.

Afterwards, referring to FIG. 1C, a phosphor layer 140 is blanketly coated over the leadframe 100 surface and the LED chips 120, by spraying, dotting, dipping, or printing, for example. Alternatively, the phosphor layer 140 can be coated to cover only the LED chips 120 (as shown in FIG. 2A).

Referring to FIG. 1D, within each leadframe unit 100a, an encapsulant 150 is formed over the LED chip 120 and the leadframe 100 in the present embodiment for encapsulation. The method for encapsulating the LED chip 120 and the leadframe 100 is, for example, an injection molding process, transfer molding process or overmold molding process.

The encapsulant 150 covers the phosphor layer 140, the LED chip 120 and wires 131/133 and fills up the trenches 102a/102b. The encapsulant 150 further includes a lens region 150a for helping converge the light emitted by the LED chip 120. The shape or size of the lens region 150a can be changed by adjusting the shape of the mold used in the molding process. In general, the lens portion 150a is located above the middle portion of the LED chip 120 covering a part of the first lead portion 100b, a part of the second lead portion 100c and a part of the second trench 102b, for example.

In this embodiment of the present invention, except for its protection effects, the encapsulant 150 is a transparent encapsulant to facilitate the light emitted from the LED chip 120 to propagate to the outside environment. For example, the encapsulant 150 can be made of any transparent or translucent polymer having hardness larger than Shore D 30, preferably silicone resins(organo polysiloxane), epoxy-silicone hybrid resin, or epoxy resin. In addition, encapsulant 150 may further include organic or inorganic fillers, such as light wavelength conversion materials (fluorescence powders, for example), for better optical performances or depending on the design requirements.

Referring to FIG. 1E, a sawing process is performed to cut through the first trenches 102a and the encapsulant 150 filled within the first trenches 102a, so that the leadframe units 100a are separated from one another. The sawing process is performed in a direction from the backside to the top surface of the leadframe (shown in arrow). Therefore, individual package units 10 are obtained. At the same time, the same sawing process also cuts through the bottom of the second trenches 102b but stops at the encapsulant 150 filled within the second trenches 102b. The sawing width should be smaller than the width of the first and second trenches 102a/102b. That is, the width of the trenches 102 is wider that the cutting tool (e.g. blade) used for the sawing process for separating the units (i.e singulation process). Hence, after sawing, the first lead portion 100b is physically separated from the second lead portion 100c, a slit 101 is formed by cutting through the bottom of the second trench 102b and the encapsulant 150 is exposed through the slit 101.

According to the present invention, as the first and second lead portions are not separated during the molding process, the occurrence of overflows can be avoided completely devoid of the extra backside taping process. However, due to the encapsulant filled within the second trenches, the encapsulated chips and/or wires are still protected and not exposed by the slit. Moreover, the sawing process simultaneously singulates the package units and separate the first and second lead portions of the leadframe.

The packaging process as described in the present invention is simple and straightforward, which can avoid the occurrence of overflow without employing extra steps.

Referring to FIG. 2A, each package unit 10 includes at least a LED chip 120 disposed on a portion of the leadframe 100 and electrically connected to the leadframe through at least one wire 130, a phosphor coating layer 140 and an encapsulant 150. As the sawing width B is smaller than the width A of the trench 102, the encapsulant 150 filled within the trench 102a is not completely removed even though the sawing process cuts through the encapsulant 150 filled within the trench 102a. If considering the encapsulant 150 covering the leadframe 100 has a hat-like shape, the lens portion 150a can be considered as the crown part, stretching outward as the brim portion 100b and the downwardly protruding flange 150c at the edge of the encapsulant 150. As shown in the right enlarged portion, after singulation, an L-shaped junction is formed between the encapsulant 150 and the leadframe 100 at the edge of the leadframe unit 100a. That is, at the edge of the leadframe unit 100a (along the singulation scribing line), the flange 150c of the encapsulant 150 is locked to the L-shaped recess of the leadframe 100. Such locking structure can improve the adhesion between the molding compound and the leadframe and strengthening the package structure. Also the locking structure lengthens the path for external moisture penetration, leading to better moisture protection effects.

As shown in the left enlarged portion of FIG. 2A, after singulation, the leadframe unit 100a includes a slit 101 within the leadframe 100, and the encapsulant 150 filled within the second trench 102b (and the underlying phosphor layer) is exposed by the slit 101.

Figure 2B:
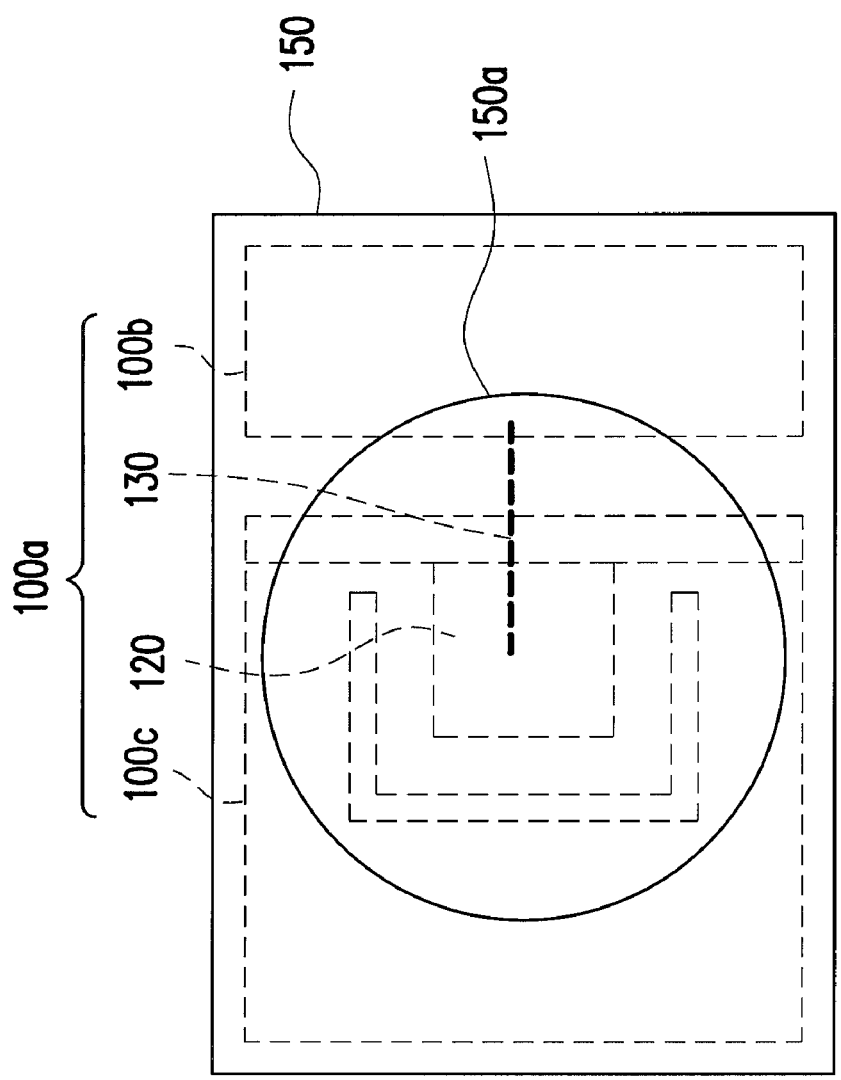
FIG. 2B is an example of a top view for the LED package structure of FIG. 2A.

FIG. 2B is an example of a top view of FIG. 2A, the lens portion 150a is located above the middle portion of the LED chip 120, covering a part of the first lead portion 100b, a part of the second lead portion 100c and a part of the second trench 102b, for example.

The package structure may further include one or more Zener diodes, varistors or other passive devices, according to the product requirements.

According to the present invention, as the package structure fabricated by the above-mentioned packaging process provides better moisture protection and strengthened structure, it also affords better yield and reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode package structure, comprising:
   a leadframe having a first lead portion and a second lead portion separated by a slit;
   at least a light emitting diode (LED) chip disposed on a top surface of the leadframe and on the second lead portion of the leadframe, wherein the LED chip is electrically connected to the leadframe;
   a phosphor layer covering the LED chip; and
   an encapsulant covering the LED chip, the phosphor layer and the leadframe, the transparent encapsulant comprises a lens portion, a brim portion surrounding and extending sidewards and outwards from the lens portion and a flange protruding downwardly from the brim portion, wherein the flange of the encapsulant is tightly fitted to a side recess of the leadframe, so that side surfaces of the brim portion and the flange of the encapsulant are coplanar with that of the leadframe and a portion of the encapsulant is exposed by the slit.

2. The package structure of claim 1, further comprising a silver layer over the leadframe and underneath the phosphor layer and the LED chip.

3. The package structure of claim 1, wherein the encapsulant is a transparent or translucent polymer having a hardness larger than Shore D 30.

4. The package structure of claim 1, wherein the encapsulant is made of silicone resins, epoxy-silicone hybrid resins, or epoxy resins.

5. The package structure of claim 1, wherein the encapsulant further comprises inorganic fillers.

6. The package structure of claim 1, wherein the encapsulant further comprises organic fillers.

7. The package structure of claim 1, further comprising a passive device disposed on the leadframe.

8. The package structure of claim 1, wherein the LED chip is electrically connected to the first lead portion of the leadframe through a wire.

9. The package structure of claim 1, wherein the phosphor layer covers the LED chip and the leadframe.

* * * * *